(12) United States Patent
Johansson

(10) Patent No.: US 6,330,177 B1
(45) Date of Patent: Dec. 11, 2001

(54) CAM/RAM MEMORY DEVICE WITH A SCALABLE STRUCTURE

(75) Inventor: Henrik Johansson, Romakloster (SE)

(73) Assignee: Switchore, A.B. (SE)

( * ) Notice: Subject to any disclaimer, the term of this patent is extended or adjusted under 35 U.S.C. 154(b) by 0 days.

(21) Appl. No.: 09/574,354

(22) Filed: May 19, 2000

(30) Foreign Application Priority Data

May 19, 1999 (SE) .................................................... 9901808

(51) Int. Cl.⁷ .................................................... G11C 15/00
(52) U.S. Cl. .................. 365/49; 365/189.07; 365/230.03
(58) Field of Search ............................ 365/49, 230.03, 365/189.07, 195

(56) References Cited

U.S. PATENT DOCUMENTS

| | | |
|---|---|---|
| 5,051,949 | 9/1991 | Young . |
| 5,383,146 | 1/1995 | Threewitt . |
| 5,386,413 | 1/1995 | McAuley et al. . |
| 5,440,715 | 8/1995 | Wyland . |
| 5,467,349 | 11/1995 | Huey et al. . |
| 5,706,224 | 1/1998 | Srinivasan et al. . |
| 5,999,434 | * 12/1999 | Yoneda et al. ........................... 365/49 |
| 6,128,207 | * 10/2000 | Lien et al. .............................. 365/49 |
| 6,134,135 | * 10/2000 | Andersson .............................. 365/49 |

FOREIGN PATENT DOCUMENTS

| | | | |
|---|---|---|---|
| 0 612 154 A1 | 2/1994 | (EP) | ............................ H03K/19/177 |
| 0 883 132 A2 | 4/1998 | (EP) | ............................... G11C/16/00 |
| 2 755 531 | 3/1987 | (FR) | ............................... G11C/15/04 |
| 07288541 | 10/1995 | (JP) | ............................... H04L/12/46 |
| 08115262 | 5/1996 | (JP) | ................................ G06F/12/10 |

OTHER PUBLICATIONS

IBM Technical Bulletin vol. 39, No. 8, Aug. 1996.
IBM Technical Bulletin vol. 38, No 4, Apr. 1995.
Schultz, K et al., Fully Parallel Integrated Cam/Ram Using Preclassification to Enable Large Capacities, IEEE vol. 31, No. 5, May 1996.
Yamagata, T, et al.: A 288–kb Fully Parallel Content Addressable Memory Using a Stacking–Capacitor Cell Structure; IEEE vol. 27, No. 12, Dec. 1992.
08225730 Aug. 1996 JPX H04L 12/56.
10233778A JPX G06F 13/00.

* cited by examiner

Primary Examiner—Son Mai
(74) Attorney, Agent, or Firm—Coudert Brothers

(57) ABSTRACT

The present invention relates to a CAM/RAM memory device with scalable structure with a CAM (Content Addressable Memory) mode and a RAM (Random Access Memory) mode, where selectable parts of the memory cells can be masked off for the CAM mode and reading and writing may be performed directly through an address decoder in the RAM mode. The memory is divided into blocks (1), each having a number of rows. The address decoder (2) is connected by word lines (3) to the cells in a row of the blocks (1) and a multiplexer (4) is adapted to select which block of memory to read data from. The memory device further includes a blocking means adapted to block the word lines when the memory device is in a CAM match read mode, such that several parallel hits in different blocks may be read without generating an invalid read-out.

9 Claims, 4 Drawing Sheets

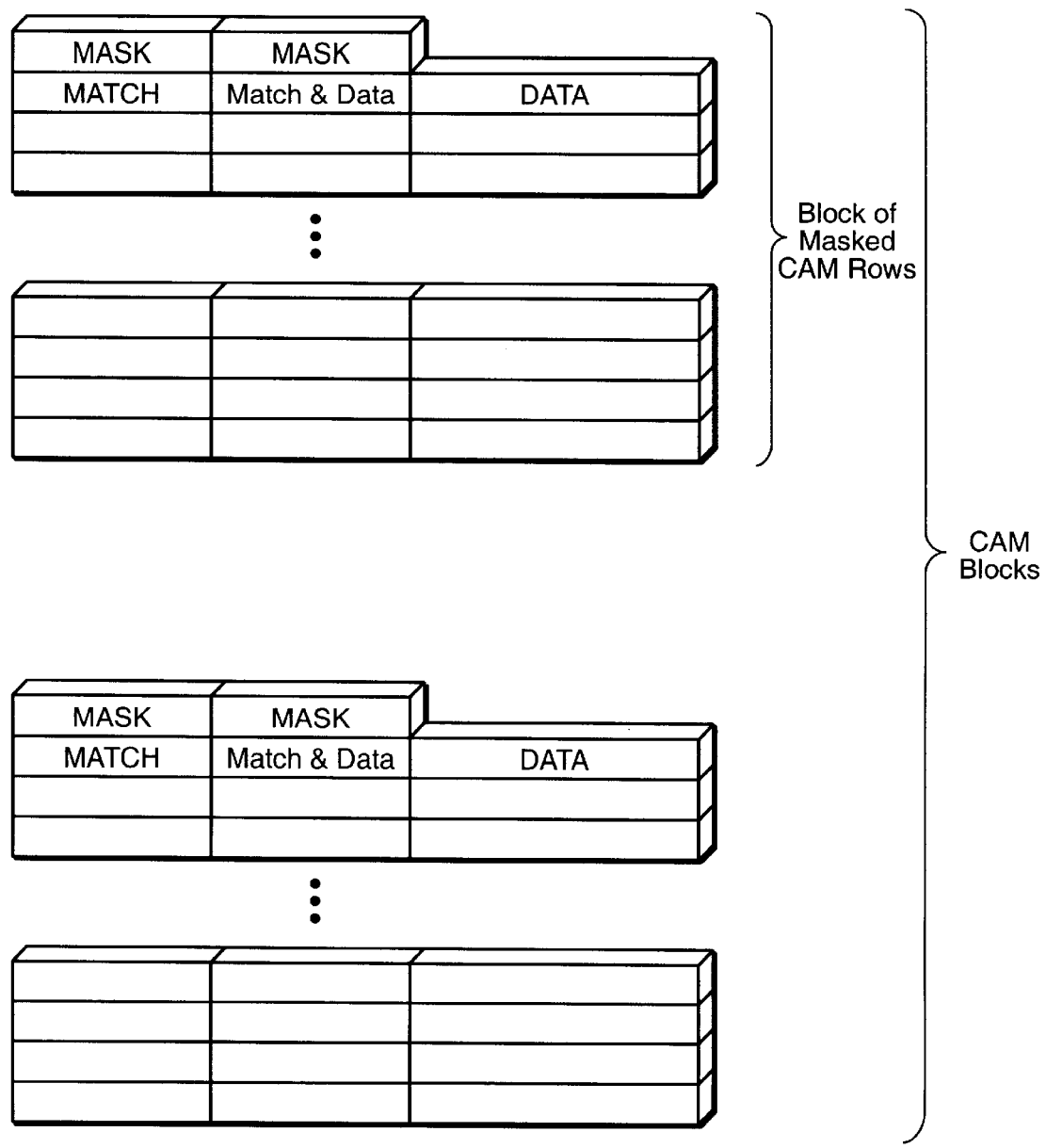
FIG._1

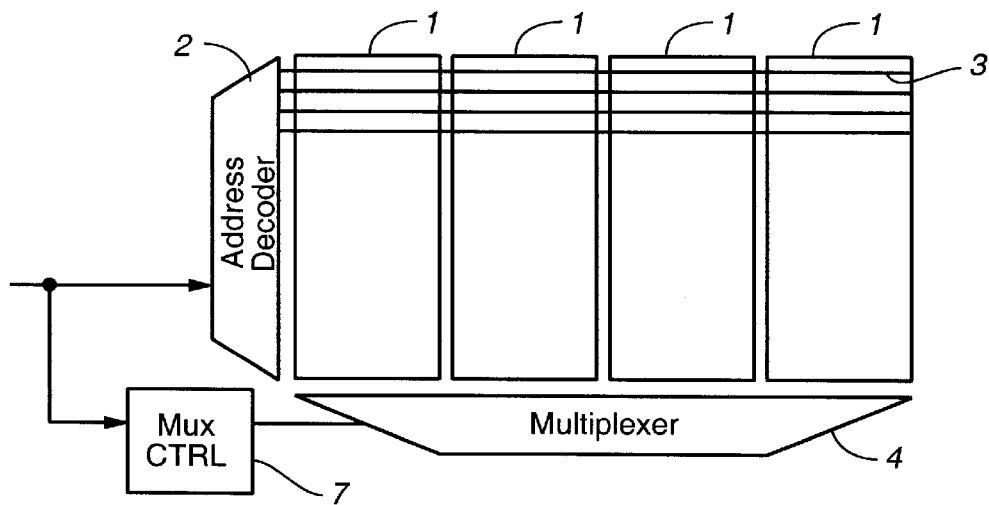
FIG._2a (PRIOR ART)
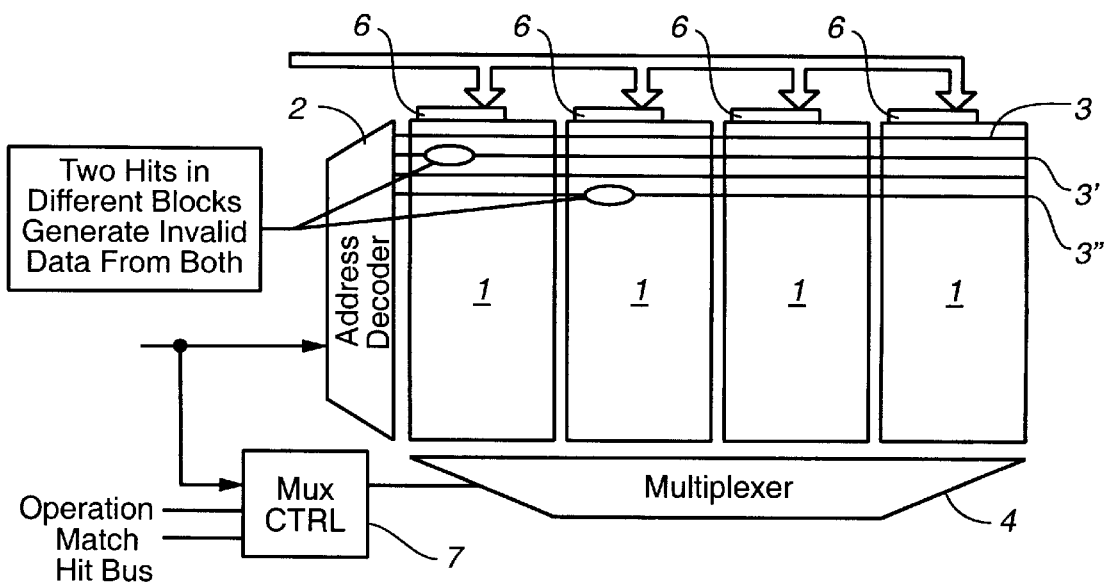
FIG._2b (PRIOR ART)

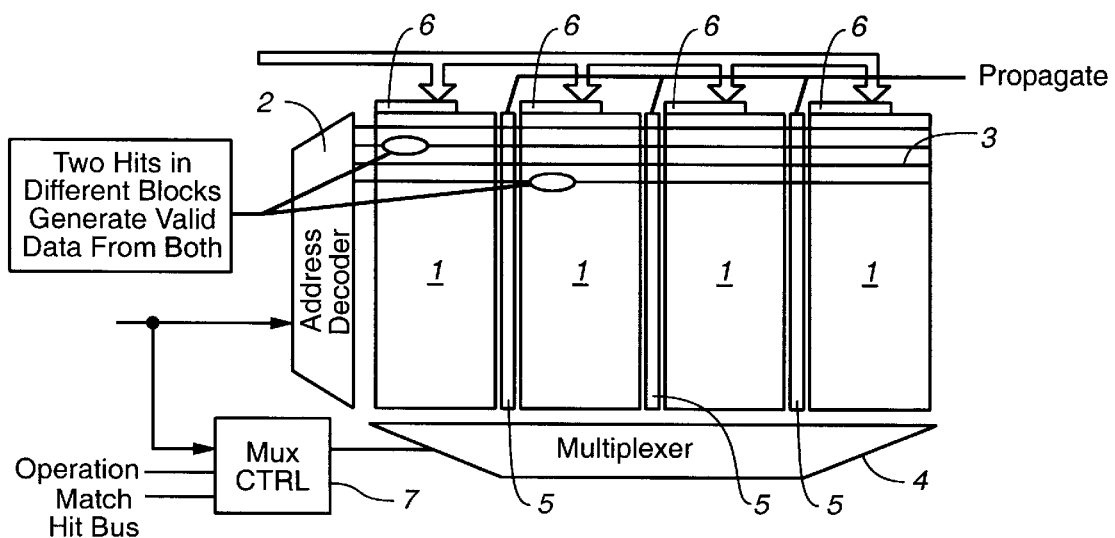
FIG._2c

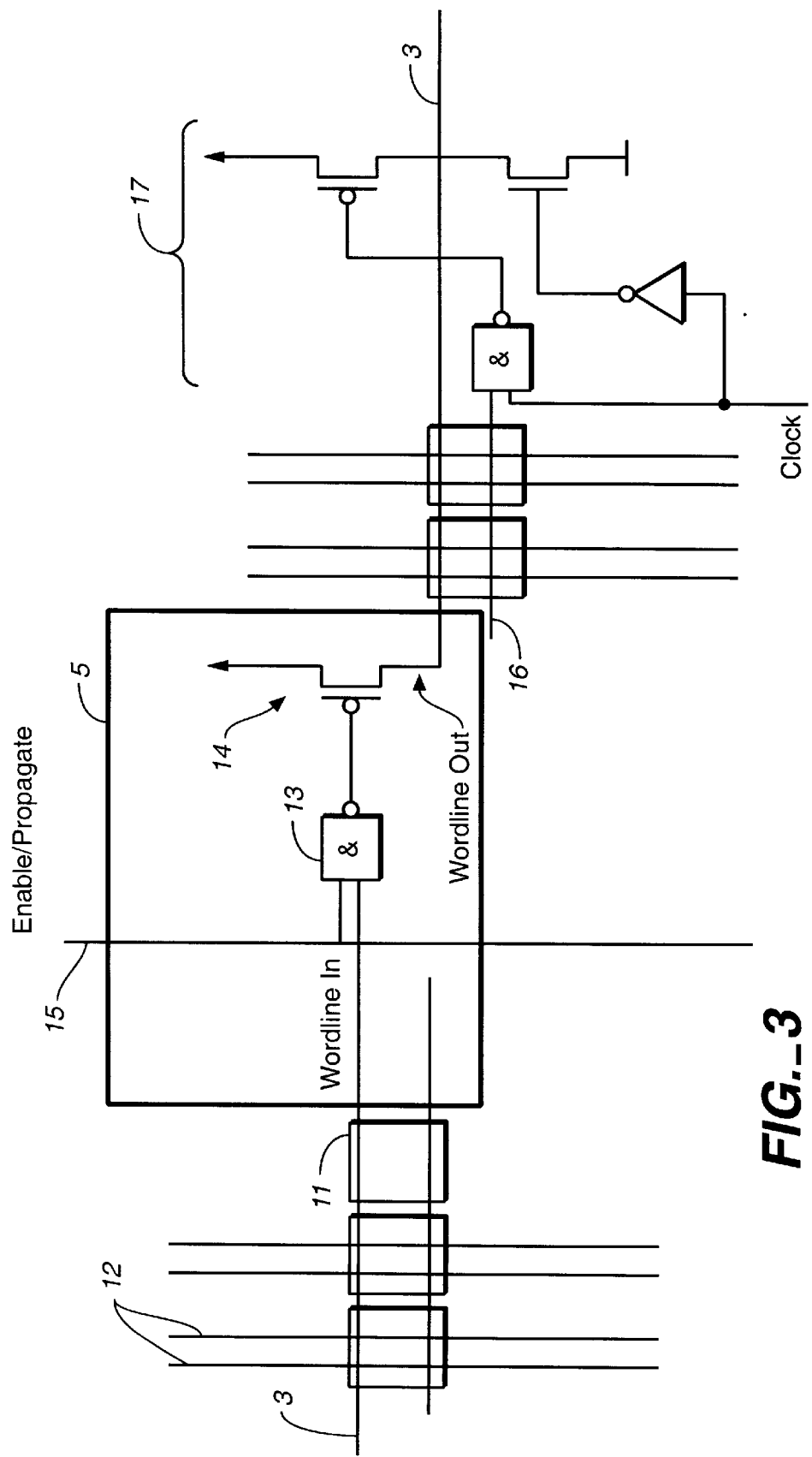
FIG._3

CAM/RAM MEMORY DEVICE WITH A SCALABLE STRUCTURE

FIELD OF INVENTION

The present invention relates to a CAM/RAM memory device with a scalable and flexible structure. CAM/RAM in this document means that the memory device functions both as a CAM (Content Addressable Memory) with matching operations and also has all ordinary RAM (Random Access Memory) functionality, i.e. a memory device with a CAM match operation mode and a RAM addressed read mode, where selectable parts of the memory cells can be masked off for the CAM mode and reading and writing may be performed directly through an address decoder in the RAM addressed read mode. CAM/RAM memory devices are especially useful, but not limited to, address look-up devices. The memory device employs a block structure for an efficient use of the silicon area. Blocks are arranged in parallel with common word lines running through all the blocks and operative in both RAM read/write and CAM look-up. By means of the present invention the word lines may be blocked between parallel blocks allowing a valid CAM match read out from more than one block simultaneously.

STATE OF THE ART

CAM memories are attractive for use in address look-up devices, and there are many different implementations of doing so. A general structure contains a CAM memory where selectable parts can be masked off to implement different look-up schemes and get the ability to handle hierarchical addresses. To get an efficient handling of address learning and changes of the look-up table it is also desirable to have a CAM that in parts works as an ordinary RAM. For address flexibility it is also desirable to have the partitions into CAM and pure RAM configurable. There exists a number of different ways of achieving these memories and examples include those described in e.g. U.S. Pat. No. 5,383,146 (Threewitt) and U.S. Pat. No. 5,706,224 (Srinvasan et al.).

When using the above mentioned CAM/RAM devices, some new problems arise. For reasons of simplicity and size it is desirable to use the same word line when reading data generated by a CAM match, as in the case of an ordinary RAM addressed read, i.e., the match function should activate the same word lines as the address decoder. The priority function handling CAM matches takes care of ensuring that only one match is generated in a block of memory. Hits in different blocks should be prioritised by logic outside the memory block controlling the multiplexer used by RAM reads as well. This creates a problem when a multiple match generates hits on different positions of the blocks as shown in FIG. 2b described more in detail below. Here it is obvious that two word lines are activated simultaneously, which causes invalid data from all memory blocks. One way to avoid this would be to have a separate address decoder for each block of memory, but, as stated before, since simplicity and size is important, this is not a satisfying alternative.

The present invention solves this problem by placing a blocking means between the memory blocks as shown in FIG. 2c, thereby enabling a selection of whether or not to propagate the word line. This creates a way of isolating the word line for each memory block in the case of a matching operation, and of keeping the shared word line for ordinary RAM addressed reads and writes. The area for this block of propagation gates is small compared to the demand of seperate address decoders for each block.

SUMMARY OF THE INVENTION

The present invention provides a CAM/RAM memory device with a scalable structure comprising a memory divided into blocks. Each block has a number of rows of memory cells. An address decoder is connected by word lines to the cells in a row of the blocks and a multiplexer is adapted to select which block of memory to read data from. Vertical match data lines implement the CAM functionality of the memory device.

According to the invention the memory device includes means for blocking the word lines between the blocks. Particularly, the blocking means is adapted to block the word lines when the memory device is in a CAM match read mode, such that several parallel hits in different blocks may be used for CAM match operations, without generating an invalid read-out. The memory device has a very useful application as a device for handling address look-up, e.g. in a switch or router.

The scope of the invention is defined in the accompanying claims.

By means of his arrangement, the invention makes efficient use of the available silicon area. Also, the memory device is flexible since all the memory cells may be handled directly in RAM mode for reading and writing. Thus, the data structure is easily changed including the mask data of the CAM functionality.

BRIEF DESCRIPTION OF THE DRAWINGS

The invention will be described in detail below with reference to the accompanying drawings, of which:

FIG. 1 is a diagram of the basic scalable CAM/RAM structure,

FIG. 2a is a diagram of the prior art CAM/RAM block structure,

FIG. 2b is a diagram illustrating an invalid read operation in the prior art memory device structure, FIG. 2c is a diagram of the CAM/RAM block structure according to the present invention in a valid read operation, and FIG. 3 is a diagram illustrating an embodiment of the blocking means according to the present invention.

DETAILED DESCRIPTION OF PREFERRED EMBODIMENTS

When using these CAM/RAM structures as parts of a custom integrated single chip device it is important that the structure is flexible both in terms of configurability and physical form factor. The intention of the present invention is to enable a more flexible partitioning of the complete structure for this kind of memory.

The basic CAM/RAM structure looks as in FIG. 1. Here input data is compared with the contents of a match field and bits not to be considered in the comparison are defined in a mask.

As is known in the art, each row of the memory contains cells or parts of a cell which hold a match part to be compared with a mask and a data part which is the stored usefull data. These parts may be viewed as the CAM parts and RAM parts, respectively. The configuration of the sizes of the CAM and RAM parts is dynamically changeable which is useful for handling, e.g., different types of address look-ups. It is especially useful if some part of the row may be configurable to hold either match bits or data bits.

As is described in the introduction of the specification, the form factor and size is important leading to the block structure as is shown in FIG. 2a. The memory is partitioned into blocks 1 of, e.g., 512 words. In FIGS. 2a, 2b and 2c only four blocks 1 are shown but generally the device includes more parallel blocks to offer a complete memory space of, e.g., 8 k words. An address decoder 2 is connected to all the memory rows of the blocks by means of word lines 3 of which only the top) four are indicated. The address decoder 2 cooperates with a multiplexer 4 to enable reading and writing of the individual memory cells. The multiplexer 4 selects output data from a sense amplifier (not shown) from one selected memory block 1. The block selection is controlled by control logic 7 (Mux CTRL) which is responsive to the kind of operation (RAM addressed read or CAM match operation read), some address bits, and prioritising between hits in different blocks 1. The control logic 7 receives commands from an operation line and match hit bus (shown in FIGS. 2b and 2c).

In a RAM addressed read mode, the address decoder 2 and the multiplexer 4 cooperate to enable reading and writing by means of the word lines and bit lines. In a CAM mode, the masks 6 (shown in FIGS. 2b and 2c) are applied to the bit lines thus forming match data lines running vertically through the memory blocks. There may be several hits in the same block 1. As is known in the art, a priority function (not shown) handling CAM matches takes care of ensuring that only one match is generated in one block 1 of memory. In other words, the priority function selects one of the plurality of matches.

However, if hits occur in several parallel blocks 1, this will lead to an invalid situation, as is shown in FIG. 2b. The match in the first block activates the second word line 3' and the match in the second block activates the fourth word line 3". Thus, since the word lines are common for all the blocks, two word lines 3', 3" are activated simultaneously. Since the bit lines run vertically through all the rows, the bit lines are driven by more than one memory row simultaneously. In this situation, the sense amplifier cannot output valid data.

FIG. 2c illustrates the structure of a memory device according to the present invention to solve the above-mentioned problem. For easy reference, the same reference numerals of the elements identical with the prior art have been used in FIG. 2c. The novel feature of the invention is a blocking means 5 applied on the word lines 3 between each block 1. The blocking means 5 is generally formed by "switches" which may be switched between two positions. In one position the word line is unblocked and the signals may propagate, and in the second position the word line is blocked which will isolate all the blocks from each other. The switches may be implemented by true switches or transfer gates or preferably by logic circuitry as is described below with reference to FIG. 3. In the unblocked position the memory device may be used as before, especially for the RAM addressed read mode. In the CAM match operation mode, the word lines are blocked such that a match in one block does not activate the word line in another block and all matches may be read by the multiplexer. Hits within the same block are taken care of by the priority function as before.

A preferred embodiment of the blocking means is shown in FIG. 3. The memory comprises cells 11 for storing mask and data bits. The cells are interconnected by word lines 3 and match lines 16 along the rows, and by bit lines 12 and match data lines (not shown) across the rows. The cells are divided into blocks with a blocking means 5 placed on the word line between each block.

The blocking means comprises logic circuitry in the form of a NAND gate 13 and a P type transistor 14. The NAND gate 13 receives input signals from the word line and an enable/propagate terminal 15. The output of the transistor 4 is the output of the blocking means, i.e. the continuation of the word line (word line out).

A precharge and match logic means 17 is located in each block on the word lines 3 and match lines 16. As may be seen, the word lines are precharged to low by an inverter and a transistor when the clock is low. When the clock and the match line are high, the word line is pulled high through a NAND gate and another transistor. The precharge and match logic means can be placed together with the blocking means.

In the RAM addressed mode, the word lines may be set high by the address decoder to activate cells for reading and writing through the bit lines. The clock is high. Enable is set high. The match line is low. The function of the logic circuitry is as follows. If word line in is high (activated), the word line out will also be high. If word line in is low, the word line out will remain as before (precharged to low). In other words, the address decoder may activate a whole row from left to right. The multiplexer selects the appropriate block.

In the CAM match read mode, match data is supplied through the vertical match data lines and compared with mask bits in the mask part of the cells. A match will activate the match line. The match lines pass through the priority function (not shown) to take care of multiple matches within the same block. If it is a prioritised match, the match line will activate the word line through the match logic 17 to activate the cells for reading. The clock is high. Enable is set low. The function of the logic circuitry is as follows. If the match line is high (a match), the word line will be pulled high in the whole block. However, since enable is low, this will not be propagated to the surrounding blocks. If match line is low (no match), the word line will remain low as before (precharged to low). In other words, a match will only activate a word line within a block.

The blocking means according to the present invention thus makes it possible to implement the block structure of the memory device resulting in an efficient use of the available silicon area in a flexible way. A person skilled in the art will appreciate that the embodiment of the invention described in detail here may be varied as to form and sizes of the various parts. Terms such as vertical and horizontal are used only in a figurative sense and in relation to each other. The scope of the invention is only limited by the claims below.

What is claimed is:

1. A CAM/RAM memory device with a scalable structure comprising a memory divided into blocks (1), each block having a number of rows of memory cells, an address decoder (2) connected by word lines (3) to the cells in a row of the blocks (1), a multiplexer (4) adapted to select which block of memory to read data from, and vertical match data lines implementing CAM functionality of the memory device, characterised by means (5) for blocking or propagating the word lines (3) between the blocks (1).

2. A memory device in accordance with claim 1, characterised in that the blocking means (5) is adapted to block the word lines (3) when the memory device is in a CAM match operation read mode, such that several parallel hits in different blocks may be read.

3. A memory device in accordance with claim 1 or 2 characterised in that the blocking means (5) comprises logic circuitry (13, 14) blocking an active word line in a CAM match operation read mode.

4. A memory device in accordance with claim 3, characterised in that the logic circuitry comprises a NAND gate

(13) connected to a P type transistor (14), the NAND gate (13) receiving a word line (word line in) and an enable signal (15) on its input terminals, while the output of the transistor (14) constitutes the continuation of the word line (word line out), wherein the NAND gate is arranged to bring the transistor (14) to go high when the word line (word line in) and the enable signal (15) are both high.

5. A memory device in accordance with claim 1 or 2, characterised in that the blocking means (5) comprises switches arranged on the word lines (3) between the blocks (1).

6. A memory device in accordance with claim 3, characterised in that the switches comprise transfer gates.

7. A memory device in accordance with claim 1, characterised by a priority means for selecting a valid hit when several hits occur in one block.

8. A memory device in accordance with claim 1, characterized in that the memory cells have a dynamically changeable configuration of CAM and RAM parts.

9. Use of a memory device in accordance with claim 1, characterized in that the memory device handles address lookup.

\* \* \* \* \*